United States Patent [19]

Emmons

[11] Patent Number: 4,586,006

[45] Date of Patent: Apr. 29, 1986

[54] CRYSTAL OSCILLATOR ASSEMBLY

[75] Inventor: Donald A. Emmons, Carlisle, Mass.

[73] Assignee: Frequency and Time Systems, Inc., Beverly, Mass.

[21] Appl. No.: 624,392

[22] Filed: Jun. 25, 1984

[51] Int. Cl.⁴ .............................................. H03B 1/00
[52] U.S. Cl. ..................................... 331/69; 219/210; 331/70; 331/158
[58] Field of Search ................ 219/210; 310/315, 343, 310/344; 331/69, 158, 70

[56] References Cited

U.S. PATENT DOCUMENTS 4,157,466 1/1979 Herrin .................................. 219/210
4,396,892 8/1983 Frerking et al. ....................... 331/69

Primary Examiner—Eugene R. LaRoche
Assistant Examiner—James C. Lee

[57] ABSTRACT

An assembly for a quartz crystal oscillator housed within a can is set forth in which the oven assembly for the crystal is partially formed with metallized circuit boards to which the components for the electrical circuits for controlling the crystal oscillator are connected. A control transistor is directly mounted to one wall of the oven to further provide the major source of heat for the oven while reducing consumption of power.

15 Claims, 4 Drawing Figures

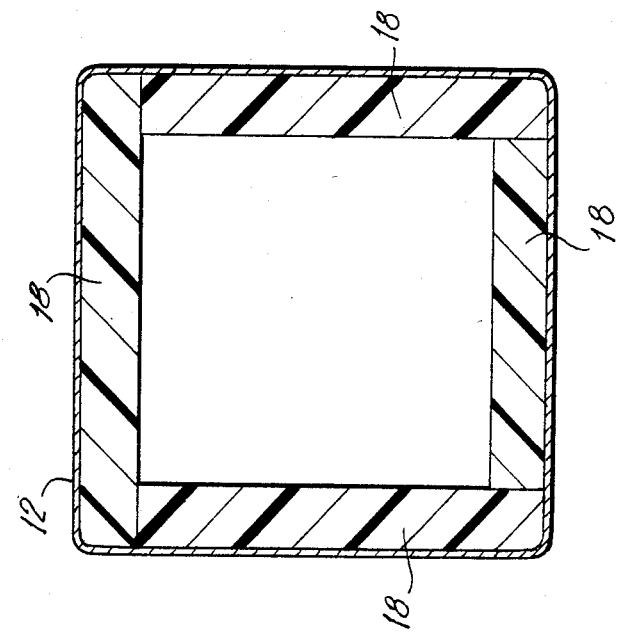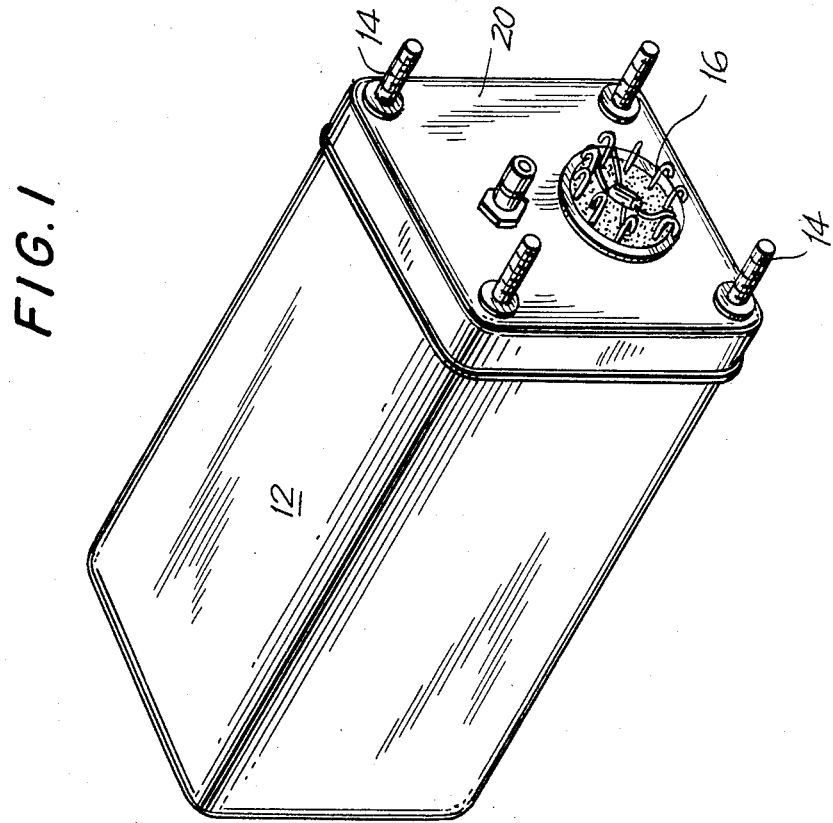

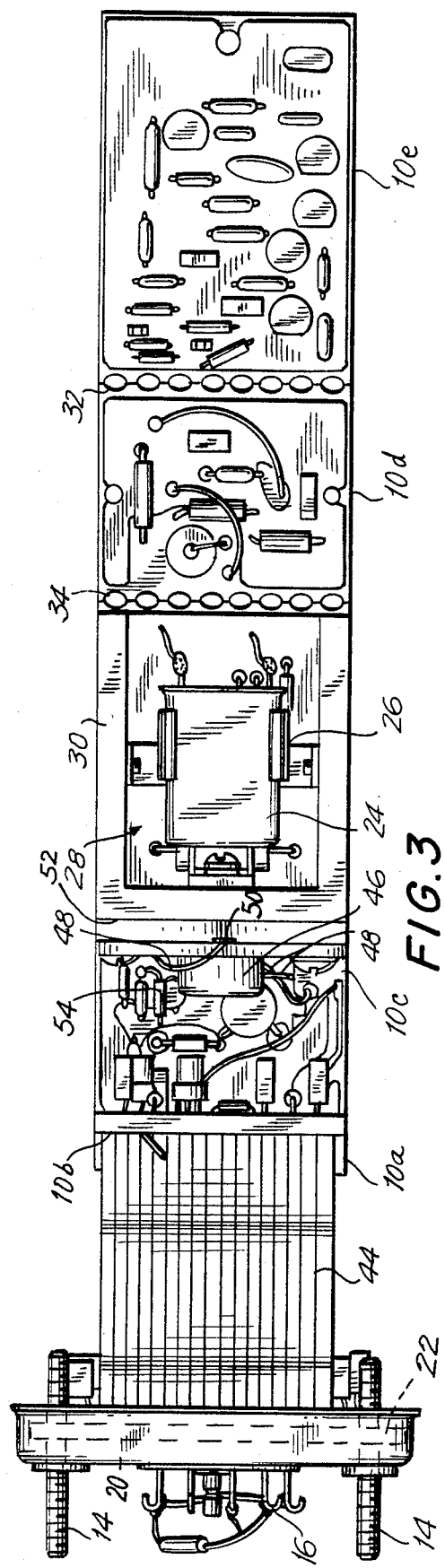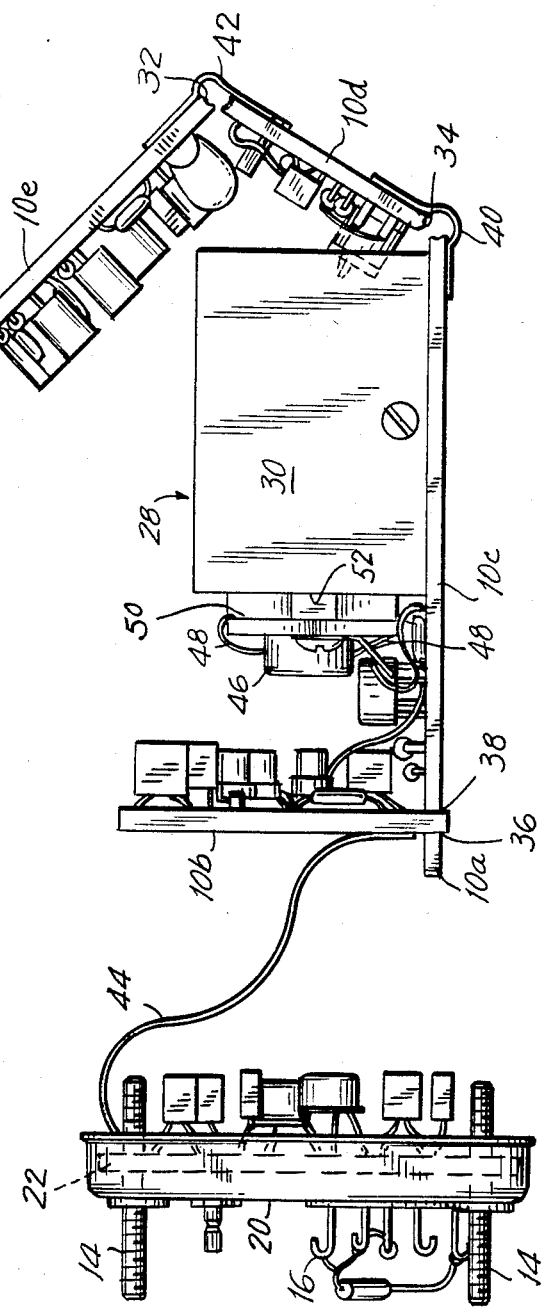

CRYSTAL OSCILLATOR ASSEMBLY

BACKGROUND OF THE INVENTION

This invention relates to a new and novel assembly arrangement for a quartz crystal oscillator, and more particularly, to such an assembly which efficiently utilizes the various components of the assembly to enhance the operation of the oscillator.

Quartz crystal oscillators are well known, accurate, reliable and dependable frequency sources. Such quartz crystal oscillators generally include a crystal which is heated in an oven, and the temperature of the oven is relatively closely controlled to stabilize the operating characteristics of the quartz crystal.

Such quartz crystal oscillators are generally formed including an electrical circuit formed of electrical components mounted on a standard PC circuit board, the PC circuit board generally forming a fairly rigid stiff base to which the circuit components are mounted. In the assembly of the quartz crystal oscillator, the components are preferably wave soldered to the circuit board to enhance the manufacturing process, which ensures the effectiveness of the electrical soldered connection.

The quartz crystal oscillators are generally placed within a substantially rectangular can, and the can is provided with a series of output points generally at the bottom of the can from which the desired signal is extracted. One of the areas of difficulty relating to the manufacture and assembly of the quartz crystal oscillator is the efficiency of the oven construction employed as well as the general power consumption and compactness of the overall design.

An object of this invention is to provide an assembly for a quartz crystal oscillator in which the components of the oscillator are assembled and housed in a compact fashion.

Another object of this invention is to provide such an assembly in which the oven for the quartz crystal is formed in an efficient and compact fashion, minimizing power and maximizing design objectives.

Still another object of this invention is to provide such a quartz crystal oscillator in which maximum utilization of all components is realized including utilization of previously wasted heat which may be employed to further heat and control the oven temperature.

Another object of this invention is to provide such a quartz crystal oscillator which is effectively insulated within the can in which it is housed.

Still another object of this invention is to provide such a quartz crystal oscillator in which the electrical components may be effectively soldered to the circuit board on which they are mounted, yet in which the circuit board arrangement during the initial soldering is not maintained, and is broken to form a portion of the oven and overall assembly of the oscillator.

Other objects, advantages and features of this invention will become more apparent from the following description.

SUMMARY OF THE INVENTION

In accordance with the principles of this invention, an assembly for a quartz crystal oscillator is formed in which the oven in which the quartz crystal is heated is comprised in part of an aluminum channel and in part of portions of the circuit board broken at appropriate linear perforation areas, such that the oven has three surfaces formed of the circuit board and three surfaces formed of an aluminum construction. The components of the electrical circuit are mounted on the circuit board to be within the oven cavity, and a control transistor formed in the epoxy case is mounted flat to one of the surfaces of the oven to directly heat the oven by utilizing the heat generated between the base and collector of the transistor. The circuit board for the oscillator is initially formed as a flat planar assembly to which the components may be wave soldered. Such wave soldering techniques are important to ensure the effectiveness of the electrical connections, yet the circuit board is so formed to include the above-identified linear perforations along which the circuit board may be cracked to form the surfaces of the oven cavity.

The oscillator includes a thermistor which serves to control the temperature of the oven, and the thermistor is so located to be close to the source of heat for stable electrical control yet be removed enough from the oven to be responsive in some measure to the ambient temperature in order to provide a large effective loop gain in the control of the oven temperature during operation of the oscillator.

BRIEF DESCRIPTION OF THE DRAWINGS

FIG. 1 is a perspective view of a crystal oscillator enclosed within its can or shell;

FIG. 2 is a view of the inside of the shell with thermal insulation indicated;

FIG. 3 is a top plan view of the oven and circuit board configuration with the circuit board shown in its flat unitary plan configuration;

FIG. 4 is a side view of the oven and electronics circuit boards in the process of forming the oven cavity.

DETAILED DESCRIPTION

The oscillator of the present invention is formed of an electrical circuit which comprises a plurality of components (FIGS. 3 and 4) mounted on a circuit board which generally is comprised of a unitary flat member designated with separate numerals 10a, 10b, 10c, 10d and 10e. The same numeral 10 is indicated for all of the separate sections of the circuit board, and the separate letter designations indicating the separate sections will become more useful hereinafter.

The electrical circuitry for the crystal oscillator generally comprises a voltage regulator section and a crystal oscillator circuit. The details of that circuitry do not form a part of this invention, and such circuitry is well known prior art.

This invention is directed to a new and novel arrangement for the packaging of the crystal oscillator including the oven cavity for the crystal as well as the overall assembly of the crystal oscillator within its shell or casing. FIG. 1 is a perspective view showing the shell or casing 12 which generally is closed having bottom posts 14 and a bottom set of connecting terminals 16 from which the output of the oscillator can be derived. Additionally, the terminals allow for the connection of suitable power and any other external connections which need to be made to operate the crystal oscillator.

One of the aspects of the present invention is the provision of an insulation within the shell or casing of of the oscillator, and this is illustrated in FIG. 2 in which sheets of thermal insulation 18 are placed within the shell to form a housing or cavity into which the crystal oscillator circuitry and circuit boards may be inserted. Such thermal insulation enhances the overall operation and reliability of the present invention and tends to lessen the sensitivity of the circuitry to vibration.

FIGS. 3 and 4 are now referred to for a further understanding of the invention. In particular, the bottom cover 20 of the shell 12 as well as the posts attached thereto are shown in FIG. 3. A circuit board 22 is mounted on the inside of the base 20, the circuit board 22 housing a number of electrical components. In one arrangement, the components mounted on circuit board 22 may comprise the voltage regulator section, since that section would be proximate to the base 20 of the can for the oscillator.

The crystal oscillator generally comprises a crystal 24 held in an assembly or clip 26 within an oven cavity region 28, the oven cavity region being formed of an aluminum U-shaped channel 30 mounted on circuit board segment 10c, the U-shaped channel providing three sides of the generally rectangular box-shape enclosure forming the oven cavity for the crystal 24. Electrical circuit components are soldered onto the circuit board segments, and it is generally understood from FIGS. 3 and 4 that the circuit board components designated by the numerals 10a–10e are initially of a single planar arrangement. The electrical components will be soldered to the circuit board prior to the aluminum channel 30 being attached thereto, and such soldering can employ the reliable wave soldering techniques, since the circuit board will be flat while the components are soldered to the circuit board.

The circuit board is comprised of a plurality of linear perforations or weakened areas 32, 34, 36, and 38, with these areas actually allowing the circuit board to be broken at those points enabling the circuit board segment to be moved with respect to each other in order to allow the assembly of the oven to be formed with the circuit boards. In particular, cables formed by ribbons 40 and 42 are effectively employed to connect the separated segments of the circuit boards, and such a ribbon arrangement 44 may also be utilized between the circuit board 22 of the base 20 of the oscillator and the remaining portions of the electronics for the crystal oscillator.

As may be clearly seen from FIGS. 3 and 4, the oven is formed by metallizing the circuit board faces of circuit board segments 10c, 10d and 10e which face inwardly to form the oven cavity, and the oven is formed by folding over these circuit board segments to close the U-shaped aluminum channel 30 and form the oven. A control transistor 46 having three leads 48 is encapsulated in epoxy 50 and forms a flat surface. This is a standard transistor configuration, that is, the device is purchased with the epoxy in place and a flat surface provided. The transistor is mounted against the bottom surface 52 of the U-shaped aluminum channel, and the control transistor thereby provides its heat directly to one wall of the aluminum channel which conducts heat therethrough to heat the oven. The three leads 48 of the transistor are directly connected into segment 10c of the circuit board, so that the transistor may be effectively wave soldered during the normal soldering operation, but the heat generated by control transistor 46 may be effectively utilized in providing a source of heat for the oven. The majority of the heat is supplied by the transistor, but a further resistor in thermal contact with the oven may be employed which becomes part of the stabilizing circuit for thermal control of the oven.

A thermistor 54 is located with respect to the oven and control transistor 46 such that it is reasonably proximate to the control transistor yet in some measure susceptible to ambient temperature, so as to allow for large effective loop gain in controlling the oven temperature and effectively controlling the control transistor heat provided to the oven.

This invention has been described with respect to certain features and embodiments set forth. Other improvements and modifications can be made to this invention without departing from the scope and spirit of the invention as set forth in the appended claims.

What is claimed is:

1. An assembly for a quartz crystal oscillator comprising a plurality of circuit components forming an electrical circuit for said quartz crystal, an oven in which heat is generated and in which said quartz crystal is carried, said plurality of components mounted on circuit board means, said electrical circuit for said oven comprising a thermistor, an improvement comprising said oven comprising a six-sided rectangular box, said circuit board means forming a plurality of sides of said oven enclosing said crystal oscillator, said electrical circuit comprising a control transistor, said control transistor having its heat-sink surface being directly mounted against one surface of said oven to heat said oven with the heat generated by said control transistor, said control transistor comprising leads soldered to a portion of said circuit board forming another surface of said oven perpendicular to said surface to which said control transistor is mounted.

2. An assembly as claimed in claim 1, wherein said improvement further comprises said circuit board means initially formed as a flat planar body to which said electrical compoments are soldered, said circuit board means comprising weakened regions about which said circuit board is cracked to form a rectangular configuration, said oven comprising an aluminum U-channel comprising a plurality of perpendicular surfaces, said rectangular configuration of said circuit boards being interfit with said aluminum U-channel to form said oven cavity.

3. An assembly as claimed in claim 2, wherein said weakened regions on said circuit board comprises a series of linear perforations.

4. An assembly as claimed in claim 2, wherein at least a portion of said circuit components are mounted on said circuit board to be within said oven cavity.

5. An assembly as claimed in claim 3, wherein said circuit board is broken apart at said areas of linear perforation enabling said circuit board elements to be manipulated and formed with said aluminum U-channel to form said oven cavity.

6. An assembly as claimed in claim 5, wherein said circuit board comprising three surfaces of said six-sided oven.

7. An assembly as claimed in claim 2, wherein said electrical circuit for said crystal oscillator comprises a control transistor, said control transistor having its heat-sink surface being directly mounted against one surface of said oven to heat said oven with the heat generated by said control transistor.

8. An assembly as claimed in claim 1, wherein said control transistor is mounted in a flat epoxy case, said flat epoxy case including said control transistor being directly mounted against said one surface of said oven.

9. An assembly as claimed in claim 1, wherein said quartz crystal assembly is mounted in a can, further comprising thermal insulation placed within said can between the inner surfaces of said can and said quartz crystal assembly.

10. An assembly as claimed in claim 1, further comprising said thermistor mounted in proximity to said control transistor, said thermistor being so located to be proximate said heat source and distant enough from said heat source to be responsive to ambient temperature.

11. An assembly as claimed in claim 1, wherein the inner face of the circuit board means forming said oven is metallized.

12. An assembly as claimed in claim 2, wherein the inner face of the circuit board means forming said oven is metallized.

13. An assembly as claimed in claim 4, further comprising said thermistor mounted in proximity to said control transistor, said thermistor being so located to be proximate said heat source and distant enough from said heat source to be responsive to ambient temperature.

14. An assembly as claimed in claim 5, further comprising said thermistor mounted in proximity to said control transistor, said thermistor being so located to be proximate said heat source and distant enough from said heat source to be responsive to ambient temperature.

15. An assembly as claimed in claim 6, further comprising said thermistor mounted in proximity to said control transistor, said thermistor being so located to be proximate said heat source and distant enough from said heat source to responsive to ambient temperature.

* * * * *